United States Patent
Matsumoto et al.

(10) Patent No.: US 9,502,241 B2
(45) Date of Patent: Nov. 22, 2016

(54) GROUP III NITRIDE CRYSTAL PRODUCTION METHOD AND GROUP III NITRIDE CRYSTAL

(71) Applicant: MITSUBISHI CHEMICAL CORPORATION, Chiyoda-ku (JP)

(72) Inventors: Hajime Matsumoto, Inashiki-gun (JP); Kunitada Suzaki, Chuo-ku (JP); Kenji Fujito, Ushiku (JP); Satoru Nagao, Ushiku (JP)

(73) Assignee: MITSUSBISHI CHEMICAL CORPORATION, Chiyoda-ku (JP)

( * ) Notice: Subject to any disclaimer, the term of this patent is extended or adjusted under 35 U.S.C. 154(b) by 368 days.

(21) Appl. No.: 14/054,036

(22) Filed: Oct. 15, 2013

(65) Prior Publication Data

US 2014/0035103 A1 Feb. 6, 2014

Related U.S. Application Data

(63) Continuation of application No. PCT/JP2012/060187, filed on Apr. 13, 2012.

(30) Foreign Application Priority Data

Apr. 15, 2011 (JP) ................................. 2011-091586
Jul. 8, 2011 (JP) ................................. 2011-151709

(51) Int. Cl.
| | |
|---|---|
| H01L 29/20 | (2006.01) |
| H01L 21/02 | (2006.01) |
| C30B 33/02 | (2006.01) |
| C30B 29/40 | (2006.01) |

(52) U.S. Cl.
CPC ......... *H01L 21/0254* (2013.01); *C30B 29/406* (2013.01); *C30B 33/02* (2013.01); *H01L 29/2003* (2013.01)

(58) Field of Classification Search
CPC .................................................. H01L 21/0254
USPC ........................................................ 257/615
See application file for complete search history.

(56) References Cited

U.S. PATENT DOCUMENTS

| | | |
|---|---|---|
| 6,180,270 B1 | 1/2001 | Cole et al. |
| 2003/0183157 A1 | 10/2003 | Usui et al. |
| 2003/0209185 A1 | 11/2003 | Ueno et al. |

(Continued)

FOREIGN PATENT DOCUMENTS

| | | |
|---|---|---|
| JP | 2001-192300 | 7/2001 |
| JP | 2007-331973 A | 12/2007 |

(Continued)

OTHER PUBLICATIONS

Extended European Search Report issued Oct. 7, 2014 in Patent Application No. 12771993.8.
R. Datta, et al., "Growth and characterisation of GaN with reduced dislocation density" Superlattices and Microstructures, vol. 36, No. 4-6,XP04655537, Oct. 2004, pp. 393-401.

(Continued)

*Primary Examiner* — Anthony Ho
(74) *Attorney, Agent, or Firm* — Oblon, McClelland, Maier & Neustadt, L.L.P.

(57) ABSTRACT

Provided is a high-quality Group III nitride crystal of excellent processability. A Group III nitride crystal is produced by forming a film is composed of an oxide, hydroxide and/or oxyhydroxide containing a Group III element by heat-treating a Group III nitride single crystal at 1000° C. or above, and removing the film.

6 Claims, 7 Drawing Sheets

(56) References Cited

U.S. PATENT DOCUMENTS

| | | |
|---|---|---|
| 2005/0095861 A1 | 5/2005 | Ueno et al. |
| 2007/0290228 A1 | 12/2007 | Yoshida |
| 2010/0173483 A1 | 7/2010 | Ueno et al. |
| 2010/0213576 A1 | 8/2010 | Hiranaka et al. |

FOREIGN PATENT DOCUMENTS

| | | |
|---|---|---|
| JP | 2008-44842 A | 2/2008 |
| JP | 2008-60519 A | 3/2008 |
| JP | 2011-006304 | 1/2011 |

OTHER PUBLICATIONS

R.J. Kamaladasa, et al., "Basic Principles and Application of Electron Channeling in a Scanning Electron Microscope for Dislocation Analysis" Microscopy: Science, Technology, Applications and Education, vol. 4, XP055036947, Dec. 2010, pp. 1583-1590.
International Preliminary Report on Patentability and Written Opinion issued Oct. 24, 2013, in International application No. PCT/JP2012/060187.
International Search Report issued Jun. 26, 2012 in PCT/JP2012/060187 filed Apr. 13, 2012.
Notification of Reasons for Refusal, in JP Patent application No. 2011-151709, issued on Sep. 25, 2015 (with machine English translation).

Fig.3(a)
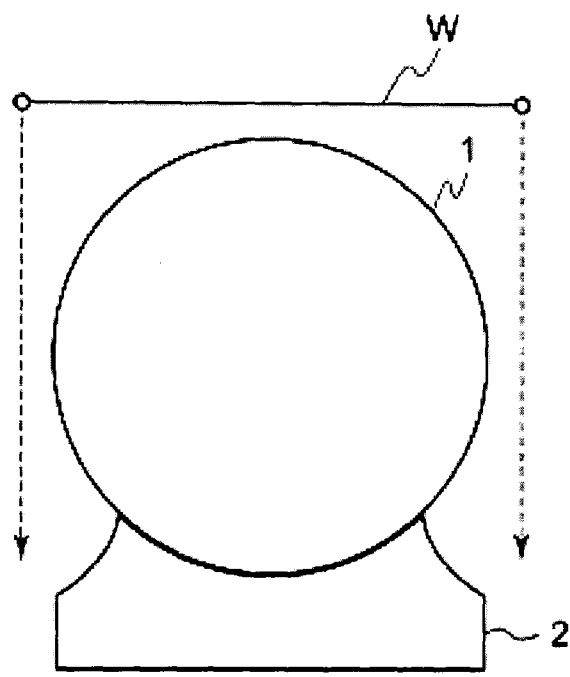
Fig.3(b)
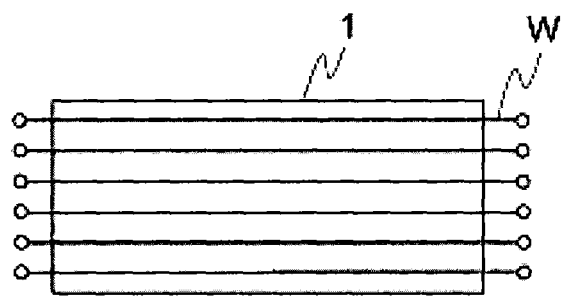
Fig.3

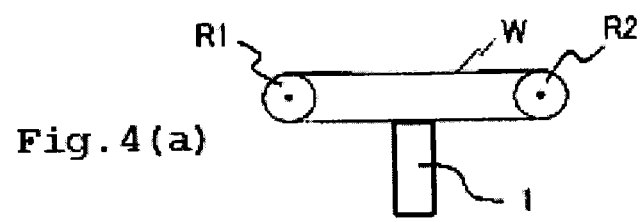
Fig.4(a)
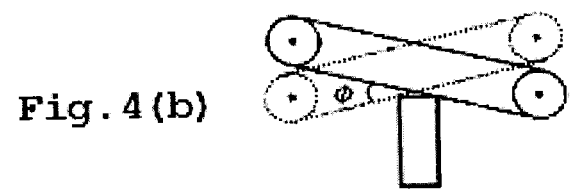
Fig.4(b)
Fig.4

GROUP III NITRIDE CRYSTAL PRODUCTION METHOD AND GROUP III NITRIDE CRYSTAL

CROSS-REFERENCE TO RELATED APPLICATION

This is a continuation of International Application PCT/JP2012/060187, filed on Apr. 13, 2012, and designated the U.S., (and claims priority from Japanese Patent Application 2011-091586 which was filed on Apr. 15, 2011 and Japanese Patent Application 2011-151709 which was filed on Jul. 8, 2011) the entire contents of which are incorporated herein by reference.

TECHNICAL FIELD

The present invention relates to a Group III nitride crystal exhibiting a processability and a crystal quality that are excellent, and to a method of producing a Group III nitride crystal endowed with such characteristics.

BACKGROUND ART

Group III nitride crystals are variously used as, for example, substrates for light-emitting devices such as light-emitting diodes (LED) and semiconductor lasers (laser diodes, or LD). Of these, GaN crystals are useful as substrates for blue light-emitting devices such as blue light-emitting diodes and blue semiconductor lasers, and are currently under active investigation.

When a Group III nitride crystal is to be used as a substrate, the crystal-grown Group III nitride crystal must be processed to the substrate shape. For example, when disk-shaped substrates are to be fabricated, the grown Group III nitride crystal is peripheral ground with a crystal grinding tool to give the crystal a round cross-sectional shape. In addition, slicing is frequently carried out to render the crystal to a desired size.

It is known that, in Group III nitride crystals, residual stress arises at the interior of the crystal as crystal growth proceeds, and that such stress induces warping of the crystal. In particular, when a Group III nitride crystal that has been grown on a different type of substrate is separated from the different type of substrate, warping sometimes becomes very apparent. It has been proposed that heat treatment be carried out in order to reduce such warping (see Patent Document 1). This patent publication states that warping is reduced by making the difference in dislocation density between the substrate side of the Group III nitride crystal and the opposite side smaller through heat treatment. Specifically, mention is made of heat-treating a GaN layer at 1200° C. for 24 hours, at 1400° C. for 10 minutes, and at 1600° C. for 2 hours.

Patent Document 1: Japanese Patent Application Laid-open No. 2003-277195

DISCLOSURE OF THE INVENTION

For example, when a GaN crystal or the like that has been grown in the c-axis direction is peripheral ground or sliced, there is a tendency for the outside edge of the crystal to chip and small cracks to form because the outer edges and sides of the crystal are brittle. Moreover, it has been found that relatively large cracks which originate at such edge damage and lead from the outside edge into the crystal interior tend to form. Efforts which have been made to address this type of problem include coating the crystal with wax, adjusting the particle size of the abrasive, and adjusting the processing speed. However, none of these approaches fully resolves the problems of damage and crack formation during peripheral grinding and slicing.

Also, in investigations by the inventors, one factor underlying the ease with which cracks propagate from the outside edge of the crystal toward the interior during processing was thought to be the presence of residual stress throughout the crystal. Patent Document 1 does mention means for reducing warping, but makes no mention whatsoever of the basal plane dislocations that are discussed in the present invention. The inventors looked into the means described in Patent Document 1, from which it became clear that none of these adequately resolve the problems of damage and crack formation during peripheral grinding and slicing.

It also became apparent that there exists a need for further improvement in terms of crystal quality as well. In view of the problems inherent with such conventional art, the inventors have conducted extensive investigations with the aim of providing both a high-quality Group III nitride crystal having an excellent processability and also a method of producing such a crystal.

As a result, the inventors have discovered that controlling basal plane dislocations in the crystal to a desirable state is very important for resolving the above problems. Moreover, through further investigations, the inventors have found that by heat-treating a Group III nitride crystal under different conditions from those hitherto used, it is possible to control dislocations in the Group III nitride crystal to a desirable state. This made it possible to resolve all at once the problems that arise from the brittleness of the crystal outside edge and the residual stress distributed throughout the crystal substrate—a groundbreaking achievement. Moreover, as a result, the inventors found that it is possible to provide Group III nitride crystals in which the state of distribution of dislocations differs from that in the conventional art and which have an outstanding crystal quality. The present invention was arrived at based on these findings, and is constituted as follows.

[1] A method of producing a Group III nitride crystal, the method comprising:
  (1) a film forming step of forming a film that is composed of an oxide, hydroxide and/or oxyhydroxide containing a Group III element by heat-treating a Group III nitride single crystal at 1000° C. or above; and
  (2) a film removing step of removing the film.

[2] The Group III nitride crystal production method according to [1], wherein the film is directly formed on the single crystal.

[3] The Group III nitride crystal production method according to [1] or [2], wherein heat treatment is carried out in the presence of an oxygen source.

[4] The Group III nitride crystal production method according to any one of [1] to [3], wherein heat treatment is carried out in the presence of alumina, zirconia, titania or a sintered body containing at least one of these.

[5] The Group III nitride crystal production method according to any one of [1] to [4], wherein heat treatment is carried out in the presence of alumina or a sintered body containing alumina.

[6] The Group III nitride crystal production method according to any one of [1] to [5], further comprising a pressurizing step.

[7] A Group III nitride crystal, including dislocation aggregates in which basal plane dislocations are arranged at intervals of 50 to 500 nm in an M plane, wherein the maximum length of the dislocation aggregates is 5 µm or more.

[8] The Group III nitride crystal according to [7], wherein the dislocation aggregates are present in the M plane in the amount of $8 \times 10^3 / cm^2$ or more.

[9] The Group III nitride crystal according to [7] or [8], wherein a dislocation density, expressed as a ratio (A/B) of the numerical density (A) of dislocation aggregates to the numerical density (B) of isolated dislocations in the M plane, is 1% or more.

[10] The Group III nitride crystal according to any one of [7] to [9], wherein the method of growing the crystal is plane C growth.

[11] A Group III nitride crystal, wherein Δd/d(ave) below is $4 \times 10^{-5}$ or less $$\Delta d/d(ave)=[d(max)-d(min)]/d(ave)$$

(where d(max), d(min) and d(ave) are respectively maximum, minimum and average values of the lattice spacing of (30-30) plane, as measured at 100 µm intervals over a length of 3.5 mm along c-axis direction.

The Group III nitride crystal of the invention is characterized by having excellent processability and a high quality. Moreover, the Group III nitride crystal of the invention diminishes the problems, seen in conventional Group III nitride crystals, of the brittleness of the crystal outside edge and the residual stress distributed throughout the crystal substrate. The inventive method of production enables a Group III nitride crystal having such characteristics to be easily produced.

BRIEF DESCRIPTION OF THE DRAWINGS

FIGS. 3A and 3B are, respectively, a side view and a top view depicting the manner in which a crystal sample immobilized on a mount is sliced with a wire.

FIGS. 4A and 4B are side views depicting the manner in which a crystal sample is sliced while rocking the wire.

BEST MODE FOR CARRYING OUT THE INVENTION

Figure 1:
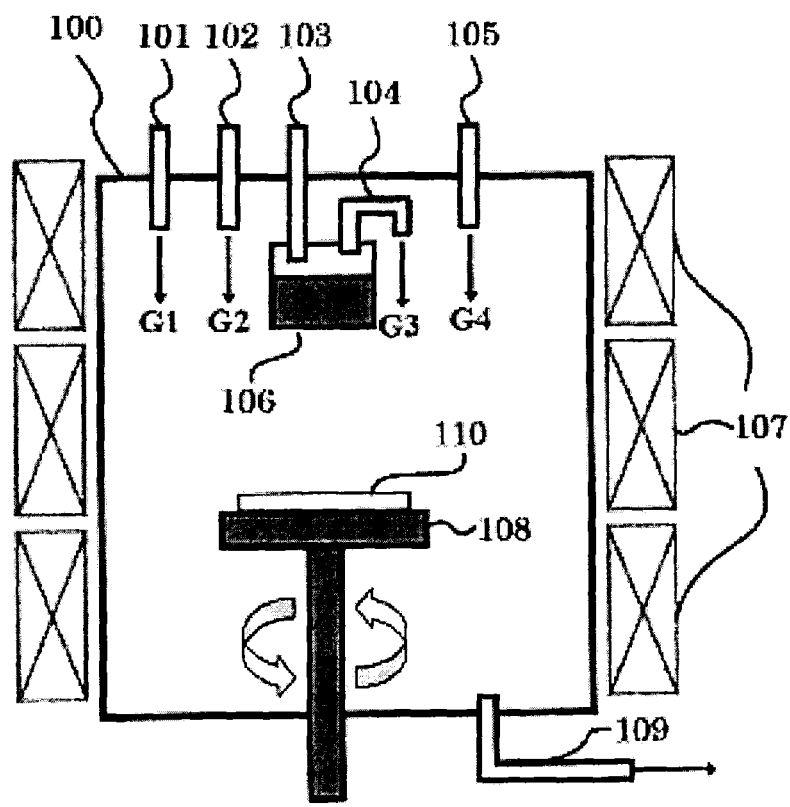
FIG. 1 is a cross-sectional view showing an example of a crystal-producing system.
Figure 2:
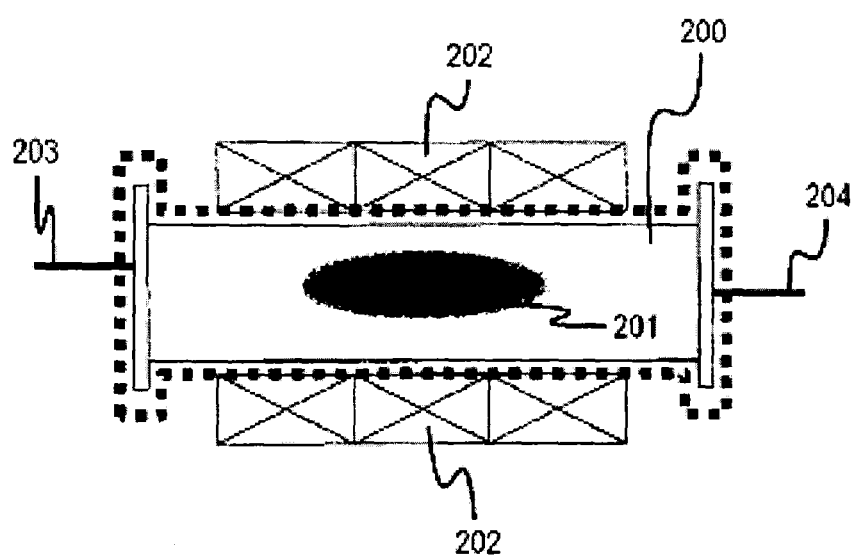
FIG. 2 is a cross-sectional diagram showing an example of a heat treatment unit.

The invention is described more fully below. Although the following descriptions of the constituent features of the invention are based on typical embodiments of the invention and specific examples thereof, the invention is not limited to these embodiments and examples. For example, although the description below mentions a GaN crystal as a typical example of a Group III nitride crystal, the invention is not limited to a GaN crystal and to a method of producing a GaN crystal. Numerical range represented using "from . . . to" in the present description means a range including the numerical values described after "from" and after "to" as a lower limit and an upper limit, respectively.

In this description, the term "C-plane" is a face equivalent to {0001} plane in a hexagonal crystal structure (wurtzite structure). In Group-III nitride crystals, C plane is a Group-III plane. In gallium nitride, C plane corresponds to a Ga plane. Moreover, in the specification, "M-plane" refers to planes collectively represented as {1-100} plane, and refers specifically to (1-100) plane, (01-10) plane, (−1010) plane, (−1100) plane, (0-110) plane, and (10-10) plane. Furthermore, in this specification, "A-plane" refers to planes collectively represented as {2-1-10} plane, and refers specifically to (2-1-10) plane, (−12-10) plane, (−1-120) plane, (−2110) plane, (1-210) plane and (11-20) plane.

[Method of Producing a Group III Nitride Crystal]
(Basic Constitution)

The inventive method of producing a Group III nitride crystal is characterized by including the following steps (1) and (2):

(1) a film forming step of forming a film that is composed of an oxide, hydroxide and/or oxyhydroxide containing a Group III element by heat-treating a Group III nitride single crystal at 1000° C. or above; and (2) a film removing step of removing the film.

The production method of the invention includes carrying out the sequence of the film-forming step (1) followed by the film-removing step (2) at least once, although a sequence of steps that includes steps (1) and (2) may be repeatedly carried out. Also, steps other than (1) and (2) may be included before step (1), between steps (1) and (2), or after step (2).

(Film-Forming Step)

In the film-forming step of the inventive production method, heat treatment is carried out under conditions where a film that is composed of an oxide, hydroxide and/or oxyhydroxide containing a Group III element forms on a Group III nitride single crystal.

The Group III nitride single crystal used in the film-forming step is a single crystal composed of the same type of Group III nitride as the Group III nitride crystal that is to be produced in this invention. For example, in cases where a GaN crystal is to be produced, a GaN single crystal is used. The Group III nitride single crystal used in the film-forming step may be a single crystal that has been grown by any of various crystal-growing methods. Any known crystal-growing method, illustrative examples of which include the HVPE method, the MOCVD method, the flux method and the ammonothermal method, may be utilized as the crystal-growing method. By way of illustration, advantageous use may be made of a Group III nitride single crystal grown by a HVPE method in which a Group III nitride single crystal grown on a different type of substrate such as sapphire serves as the underlying substrate. Details of the HVPE method used here are not particularly limited. For example, reference may be made to the conditions mentioned in the subsequently described examples.

The heat treatment temperature is set to 1000° C. or above. The heat treatment temperature should be decided together with the heat treatment time, although in general the heat treatment temperature is preferably 1100° C. or above, more preferably 1200° C. or above, and even more preferably 1300° C. or above. The upper limit in the heat treatment temperature is preferably 2500° C. or below, more preferably 2220° C. or below, even more preferably 1600° C. or below, and still more preferably 1400° C. or below.

It is preferable to shorten the heat treatment time when the heat treatment temperature is high, and to lengthen the heat treatment time when the heat treatment temperature is low. In general, the heat treatment time is set to preferably 15 minutes or more, more preferably 30 minutes or more, and even more preferably 1 hour or more. The upper limit of the heat treatment time is set to preferably 200 hours or less, more preferably 100 hours or less, and even more preferably 24 hours or less.

For example, in cases where a heat treatment temperature in the range of 1275 to 1375° C. is used, heat treatment for a period of from 0.25 to 24 hours is preferred, and heat treatment for a period of from 1.0 to 10 hours is more preferred. In cases where a heat treatment temperature in the range of 1150 to 1250° C. is used, heat treatment for a period of from 1.0 to 200 hours is preferred, and heat treatment for a period of from 24 to 100 hours is more preferred. From the standpoint of adequately promoting film formation, in cases where a heat treatment temperature in the range of 1150 to 1250° C. is used, heat treatment for a period of from 100 to 1000 hours is preferred, and heat treatment for a period of from 200 to 500 hours is more preferred.

In above Cited Document 1 as well, heat treatment is carried out on a Group III nitride single crystal, although nothing there mentioned corresponds to the film-forming step of the present invention. In one example described in Cited Document 1, a GaN layer is heat-treated at 1200° C. for 24 hours. However, even when heat treatment is carried out under such conditions, a film composed of an oxide, hydroxide and/or oxyhydroxide containing a Group III element does not form on the Group III nitride single crystal. In another example described in Cited Document 1, a GaN substrate on which $SiO_2$ has been formed by chemical vapor deposition (CVD) is subjected to 2 hours of heat treatment at 1600° C. in an atmospheric environment. However, according to investigations by the inventors, when the temperature rises to 1400° C. or above, all of the GaN single crystal ends up converting to gallium oxide, making the procedure impossible to reproduce. Because forming a film that is composed of an oxide, hydroxide and/or oxyhydroxide containing a Group III element runs counter to the objects of Cited Document 1, the film-forming step of this invention is not suggested in any way by Cited Document 1.

In this invention, the ramp-down rate for the temperature of the Group III nitride single crystal following heat treatment is generally set to 100° C./hour or above, preferably 1000° C./hour or above, and more preferably 3000° C./hour or above. Moreover, quenching at a rate of $1 \times 10^{6}$° C./hour or more may be carried out using ice water or the like.

The temperature ramp-up rate and ramp-down rate may be held constant or may be varied over time.

Heat treatment in this invention may be carried out under high pressure. If the treatment is performed under high pressure, the pressure is preferably 1 MPa or more, more preferably 10 MPa or more, and even more preferably 5 GPa or more. The pressure may be held constant during heat treatment or may be made to fluctuate. Holding the pressure constant is preferred. Pressurization may be carried out over the entire crystal, or may be carried out on only part of the crystal. Also, the degree of pressure applied may be varied depending on the part of the crystal. For example, the pressurization conditions may be made to differ at the center portion and the outer edge portion of the crystal. By locally varying the pressurization conditions, the degree of infiltration by light elements due to heat treatment of that portion of the crystal can be adjusted, thus enabling, for example, the pressurization conditions to be set for each region according to the dislocation density of the crystal. Furthermore, in this invention, pressurization may be carried out following heat treatment. For example, the subsequently described film-removing step may be carried out after pressurization subsequent to heat treatment, pressure may be applied after the sequence of steps up through the film-removing step has been carried out, or the crystal following heat treatment and the crystal following film removal may be repeatedly pressurized.

So long as heat treatment in the invention is carried out under conditions where a film composed of an oxide, hydroxide and/or oxyhydroxide containing a Group III element forms, the type of ambient gas used when carrying out heat treatment is not subject to any particular limitation. Specific examples of ambient gases include ammonia ($NH_3$), nitrogen ($N_2$) and a mixed gas thereof. The $NH_3$ concentration or $N_2$ concentration in the atmosphere is not particularly limited, although the $NH_3$ concentration is typically 0.5% or more, preferably 1% or more, and more preferably 5% or more, and is typically 50% or less, preferably 25% or less, and more preferably 10% or less. The $N_2$ concentration is generally 50% or more, preferably 75% or more, and more preferably 90% or more, and is typically 99.5% or less, preferably 99% or less, and more preferably 95% less.

Heat treatment in the invention may be carried out in a closed system or may be carried out in a flow system, although heat treatment is preferably carried out in a flow system. When a mixed gas of $NH_3$ and $N_2$ is used, the flow rate of the mixed gas is typically 50 mL/min or more, preferably 150 mL/min or more, and more preferably 180 mL/min or more, and is typically 500 mL/min or less, preferably 300 mL/min or less, and more preferably 250 mL/min or less.

Heat treatment in the invention is preferably carried out in the presence of an oxygen source. As used herein, "oxygen source" refers to a material that supplies oxygen atoms which can be used in film formation during heat treatment. For example, in cases where a film which includes a Group III oxide, a Group III hydroxide or a Group III oxyhydroxide is formed, this denotes a material which supplies oxygen atoms making up the Group III oxide, Group III hydroxide or Group III oxyhydroxide. The oxygen source may be supplied as an oxygen atom-containing gas or may be supplied by the formation, via a reaction, of an oxygen atom-containing compound. Illustrative examples of oxygen atom-containing gases include oxygen molecules, water molecules, carbon dioxide molecules and carbon monoxide molecules. The concentration of the oxygen atom-containing gas or the oxygen atom-containing compound within the atmosphere is not particularly limited, although in the case of water molecules, the concentration is typically 0.1% or more, preferably 0.5% or more, and more preferably 1.0% or more, and is typically 30% or less, preferably 20% or less, and more preferably 10% or less. The mode of forming an oxygen atom-containing compound by reaction is exemplified by the reaction of alumina making up the inner wall of the reaction vessel with ammonia within the ambient gas to form a gas of water molecules. Other examples of the material making up the inner wall of the reaction vessel include silica, zirconia, titania, and sintered bodies containing at least one of these. Aside from having the reaction vessel inner wall made of alumina or the like, other modes of forming an oxygen atom-containing compound that may be employed include one in which the surface of a substrate holder placed within the reaction vessel is made of alumina or the like, and one in which an alumina rod or alumina powder is placed within the reaction vessel.

The shape of the reactor vessel is not subject to any particular limitation. For example, the reactor may be a cylindrical vessel such as a cylindrical alumina tube. In cases where a cylindrical reaction vessel is used, a plurality of the Group III nitride single crystals to be heat-treated may be arranged vertically or horizontally, either on top of one another or side by side. Also, in order to have the ambient gas extend entirely over the entire surface of the Group III nitride single crystal, including the sides and the basal plane, it is preferable for the Group III nitride single crystal to be situated such that the surface of the crystal is not in planar contact with the reactor vessel or the like. By using a cylindrical vessel, it is possible to easily prevent planar contact between the Group III nitride single crystal and the reaction vessel and to have the ambient gas extend over the entire surface of the crystal.

In the film-forming step of the invention, the fact that a film composed of an oxide, hydroxide and/or oxyhydroxide containing a Group III element has been formed on the Group III nitride single crystal can be easily confirmed by carrying out x-ray diffraction (XRD) analysis or analyzing the wash fluid after washing with nitric acid. The film composed of an oxide, hydroxide and/or oxyhydroxide containing a Group III element is exemplified by Group III oxides, Group III hydroxides and Group III oxyhydroxides, or may be a mixture thereof. In cases where the Group III element is gallium (Ga), specific examples include gallium oxide and gallium oxyhydroxide. After carrying out the film-forming step of the invention, usually a film containing, in admixture, gallium metal, gallium oxide and gallium oxyhydroxide forms and the surfacemost portion becomes black in color, enabling film formation to be visually confirmed. Also, by "forming a film that comprises an oxide, hydroxide and/or oxyhydroxide containing a Group III element," what is meant is that the object of this step is to form, as the primary component, "a film composed of an oxide, hydroxide and/or oxyhydroxide containing a Group III element"; this step does not entail removing a film containing gallium metal and other substances present as by-products or impurities that have been inadvertently admixed in the course of production.

The amount of the Group III element-containing oxide, hydroxide and/or oxyhydroxide making up the film can be determined by the loss-of-weight ratio before and after acid washing, and it is possible to consider the migration of dislocations at the crystal interior based on the amount of film that has formed. It is desirable for the loss-of-weight ratio when a substrate having a diameter of 63 mm has been used to be from 3% to 15%. In general, the loss-of-weight ratio relates closely to the specific surface area, although there exists, regardless of size and shape, an ideal range having a lower limit which, from the standpoint of fully forming a film, is preferably 1% or more, more preferably 2% or more, and even more preferably 2.5% or more. The upper limit, which is constrained also by a decrease in the amount of crystal produced, is preferably 60% or less, more preferably 35% or less, and most preferably 25% or less.

The film composed of an oxide, hydroxide and/or oxyhydroxide containing a Group III element may be formed directly on a Group III nitride single crystal, or may be formed on another film that has been formed as an intermediate layer on a Group III nitride single crystal. However, because the advantageous effects of the invention that ensue are more pronounced, forming the film directly on a Group III nitride single crystal is preferred.

(Film-Removing Step)

In the film-removing step of the invention, the film that was formed in the film-forming step is removed.

Illustrative examples of film-removing methods include methods which involve immersing the crystal in an acid solution, and mechanical grinding. A method that involves immersing the crystal in an acid solution or a mixed acid solution is preferred because of the outstanding efficiency and convenience of this approach. Nitric acid is suitable as the type of acid used when immersing the crystal; examples of other acids that may be used include sulfuric acid and hydrochloric acid. The concentration of the acid is preferably 10% or more, and more preferably 30% or more. By using a high-concentration acid solution or mixed acid solution, film removal tends to become efficient. During immersion in an acid solution or a mixed acid solution, additional control such as stirring of the acid solution or mixed acid solution, or agitation by the application of ultrasonic vibrations, may be suitably selected and carried out. The film-removing step using an acid solution or a mixed acid solution is preferably carried out under heating. This step is carried out at a temperature of preferably 60° C. or more, and more preferably 80° C. or more.

Removal of the film in the film-removing step need not involve complete removal of the film composed of an oxide, hydroxide and/or oxyhydroxide containing a Group III element that was formed in the film-forming step. For example, some of the oxide, hydroxide and/or oxyhydroxide containing a Group III element may remain on the crystal surface after the film-removing step has been carried out, or the film containing these components may be completely removed. Also, in the film-removing step, along with removing the film composed of an oxide, hydroxide and/or oxyhydroxide containing a Group III element, components other than the oxide, hydroxide and/or oxyhydroxide containing a Group III element may be removed, the removal of at least Group III metal being preferred, and the removal of gallium metal being especially preferred. The Group III metal can be removed by immersion in the above-mentioned acid solution or mixed acid solution.

The film-removing step in the invention may be carried out immediately after the film-forming step has been carried out, may be carried out after some intervening time, or may be carried out after another step has been carried out. Examples of such other steps include coarse processing and the subsequently described slicing step and peripheral grinding step.

[Group III Nitride Crystal]

(Characteristics)

The Group III nitride crystal of the invention is characterized by including dislocation aggregates in which basal plane dislocations are arranged at intervals of 50 to 500 nm on an M plane, wherein a maximum length of dislocation aggregates is 5 μm or more.

As used herein, "basal plane dislocations" differs from the threading dislocations that are widely known in GaN crystals and the like. Threading dislocations are a considerable number of dislocations (about $10^9/cm^2$ in a GaN crystal) that arise because of greatly differing lattice constants when a GaN crystal is vapor-phase grown on a different type of substrate such as a sapphire substrate. By contrast, the basal plane dislocations referred to in this invention are dislocations which are introduced when stress-induced glide motion arises on the basal plane, and are characterized in that their direction of propagation is parallel to the (0001) plane serving as the basal plane of GaN (see Koji Maeda, Kunio Suzuki, Masaki Ichihara, Satoshi Nishiguchi, Kana Ono, Yutaka Mera and Shin Takeuchi in *Physica B; Condensed Matter*, Volumes 273-274, (1999), pp. 134-139)). Based on SEM-CL observation and transmission electron microscopic observation, the inventors have found that these dislocations propagate on the basal plane while describing an arc.

In this invention, a "dislocation aggregate" refers to a structure where basal plane dislocations are arranged at intervals of 50 to 500 nm. In conventional Group III nitride crystals, dislocation aggregates in which basal plane dislocations are arranged in parallel at such tight intervals have not been observed over a range of 5 μm or greater. In the dislocation aggregates observed in the Group III nitride crystals of this invention, it is preferable for 10 or more basal plane dislocations to be arranged in parallel, more preferable for 100 or more basal plane dislocations to be arranged in parallel, and even more preferable for 1000 or more basal plane dislocations to be arranged in parallel. With respect to the size of the dislocation aggregate, the maximum length is preferably 5 μm or more, more preferably 10 μm or more, even more preferably 50 μm or more. Also, the maximum length thereof is preferably 400 μm or less, more preferably 200 μm or less, even more preferably 100 μm or less.

The dislocation aggregates in the Group III nitride crystal of the invention have a numerical density of preferably $5 \times 10^3/cm^2$ or more, more preferably $8 \times 10^3/cm^2$ or more, and even more preferably $1 \times 10^4/cm^2$ or more. The plane for measuring the numerical density of the dislocation aggregates in the invention is an M plane.

(Controlling the Dislocations)

The inventors have carried out close microscopic examinations of conventional Group III nitride crystals, whereupon they have confirmed that the outside edges of the crystals have regions of dislocation densities as high as $1 \times 10^8$ cm$^{-2}$. They also have confirmed that the same type of dislocations are widely distributed to the center of the crystal at lower densities of from $10^6$ to $10^7$ cm$^{-2}$. The inventors have found that this localized concentration of basal plane dislocations in the outside edge has something to do with embrittlement of the outside edge, and that the uniformly dispersed state at the center portion relative to the localized concentration at the outside edge is a cause of the residual stress distributed throughout the crystal. Moreover, they have succeeded in enhancing the processability of the Group III nitride crystal by controlling the basal plane dislocations.

Specifically, by heat-treating a Group III nitride single crystal to 1000° C. or more in accordance with the production method of the invention and thereby forming a film composed of an oxide, hydroxide and/or oxyhydroxide containing a Group III element, the inventors have succeeded in collecting together within the same plane dislocations that are isolated and dispersed in the center portion of the crystal (isolated dislocations: dislocations that do not form dislocation aggregates and are isolated). As a result, a large number of dislocation aggregates that satisfy the above conditions come to be observed in the center portion of the crystal. For example, by heating-treating a Group III nitride crystal such as a GaN crystal in accordance with the inventive production method, it is possible to increase the number of dislocation aggregates in the center portion from two- to ten-fold. By thus collecting together, within the center portion of the crystal, dislocations in dislocation aggregates, the number of isolated dislocations in other regions decreases. Specifically, the dislocation density, expressed as the ratio A/B of the numerical density of dislocation aggregates (A) to the numerical density of isolated dislocations (B) observed in an M plane, is preferably 1% or more, more preferably 2% or more, and even more preferably 3% or more. As a result, the residual stress that is present over the entire crystal becomes lower and relatively large cracks which originate at damage such as small cracks that have formed in the outer edge portion having a low brittleness do not readily arise. Such grouping of basal plane dislocations appears to be a result exhibiting the most stable arrangement of basal plane dislocations in a form assisted by a driving force that lowers the residual stress at the interior of the crystal. Here, "collecting together isolated dislocations within the same plane" refers to the gathering of isolated dislocations within the same plane in the manner illustrated by the results of cathodoluminescence scanning electron microscopic observation from Example 11 shown in FIG. 5.

By carrying out heat treatment to form a film and removing the film thus formed in accordance with the inventive method of production, in addition to the advantageous effects mentioned above, brittle regions at the outer edge of the crystal can be easily removed. This appears to be, independent of any theory, due to the fact that oxygen, nitrogen carbon, hydrogen or molecules composed of these elements are introduced into the gaps where atomic bonds at the dislocation cores have broken, leading to a loss in the integrity of the wurtzite crystal structure near the dislocations. As a result, a very brittle state occurs which is of a degree such that, in mechanical terms, the application of an impact far smaller than that incurred from peripheral grinding will bring about pulverization at the place of impact. Hence, the propagation of cracks which start in damage at the outside edge of the crystal and head toward the center portion is greatly suppressed. Moreover, the fragility of the outside edge is greatly ameliorated by removing the very brittle portions. Accordingly, the inventive method of production is outstanding in that it is able to resolve at once two problems: the residual stress at the center of the crystal and the brittleness of the outside edge. The Group III nitride crystal of the invention thereby furnished has the following characteristics: the brittleness of the outside edge has been ameliorated, the residual stress is low, cracks do not readily form, and the crystal quality is excellent.

(Properties of the Crystal)

The Group III nitride crystal of the invention has a low processing damage resistance value. Moreover, the Group III nitride crystal of the invention has a long maximum dislocation propagation distance. As used herein, "maximum dislocation propagation distance" refers to the longest of the dislocations observed around a Vickers indentation introduced by a Vickers test.

The Group III nitride crystal according to another aspect of the invention is characterized in that $\Delta d/d(ave)$ is $4 \times 10^{-5}$ or less. The inventors have discovered that when the $\Delta d/d$ (ave) value of a Group III nitride crystal is $4 \times 10^{-5}$ or less, the residual stress can be reduced, and have thereby succeeded in enhancing the processability of the Group III nitride crystal.

As used herein, the change in lattice constant, represented as $\Delta d/d(ave)$, is a measure indicating the magnitude of the change when the lattice spacing of (30-30) plane was as measured at 100 μm intervals over a length of 3.5 mm along c-axis direction, and is a parameter derived as follows:

$$\Delta d/d(ave)=[d(max)-d(min)]/d(ave).$$

Here, d(max) is the maximum value of the lattice spacing in the measurement range, d(min) is the minimum value of the lattice spacing in the measurement range, and d(ave) is the average value of the lattice spacing in the measurement range. The residual stress can be reduced by making $\Delta d/d$ (ave) smaller.

The $\Delta d/d(ave)$ value for the Group III nitride crystal of the invention is typically $4 \times 10^{-5}$ or less, preferably $3 \times 10^{-5}$ or less, and more preferably $2 \times 10^{-5}$ or less. By setting $\Delta d/d$ (ave) to $4\times10^{-5}$ or less, residual stress in the Group III nitride crystal can be reduced and crack formation during processing can be suppressed.

The measurement range for d(max), d(min) and d(ave) may be set as desired depending on the size of the Ground III nitride crystal on which measurement is to be carried out. In this invention, the lattice spacings were measured over a measurement distance of 3.5 mm and at measurement intervals of 100 µm.

In cases where a Group III nitride crystal is used, the above $\Delta d/d(ave)$ value may be converted to the change in the a-axis length of the measured crystal face. For example, when the changes in the lattice constants for the lattice spacings on the {10-10} plane, the {30-30} plane, the {2-1-10} plane and the {4-2-20} plane have been measured in the direction of growth, the length of the a-axis is determined by multiplying these respectively by $2/\sqrt{3}$, $2\sqrt{3}$, 1 and 2.

(Regulating the Crystallinity)

To set $\Delta d/d(ave)$ to a value of $4\times10^{-5}$ or less, the Group III nitride single crystal should be heat-treated to 1000° C. or above in accordance with the production method of the invention so as to control the basal plane dislocations to the optimal positions. Here, because the strain distribution in the direction perpendicular to the slip plane for the basal plane dislocations (C plane) is uniform, group behavior among the dislocations readily arises due to heat treatment. As group behavior proceeds to a vertically ordered arrangement, the strain distributions possessed by the individual basal plane dislocations cancel each other out, reducing internal strain within the system (dislocation polygonization). The group behavior of the basal plane dislocations is temperature dependent. For example, to set $\Delta d/d(ave)$ to $4\times10^{-5}$ or less, heat treatment at a temperature of 1000° C. or above should be carried out, to set $\Delta d/d(ave)$ to $3\times10^{-5}$ or less, heat treatment at a temperature of 1100° C. or above should be carried out, and to set $\Delta d/d(ave)$ to $2\times10^{-5}$ or less, heat treatment at a temperature of 1200° C. or above should be carried out.

(Types of Crystals)

The Group III nitride crystal of the invention is composed of a Group III nitride. Specifically, examples include gallium nitride, aluminum nitride, indium nitride, and single crystals mixed thereof. Preferred examples include a GaN crystal or an AlGaN crystal obtained by heat-treating a C plane-grown GaN single crystal in accordance with the inventive method of production to form a film, then removing the film.

Because large Group III nitride crystals can be easily produced by the inventive method of production, the Group III nitride crystal of the invention can be set to a large size. For example, it is possible to have the crystal be a large Group III nitride crystal which is 3 inches or more in diameter. The Group III nitride crystal of the invention can be advantageously used as a substrate by suitable processing as needed. This invention makes it possible to inexpensively provide, for example, basal plane substrates, non-polar substrates and semi-polar substrates.

EXAMPLES

The features of the invention are illustrated more concretely below by way of working examples of the invention and comparative examples. The materials, usage amounts, ratios, treatment details, order of treatment and the like shown in the following examples can be suitably varied without departing from the gist of the invention. Therefore, the scope of the present invention should not limitedly be construed by the following specific examples.

(1) Evaluation of Heat Treatment and Processing Yield

A template plate which was obtained by using MOCVD to grow GaN and wherein a C plane serves as the principal plane was prepared on a sapphire substrate having a diameter of 76 mm. The template plate was placed, as the underlying substrate 110, on an SiC-coated carbon substrate holder 108 having a diameter of 85 mm and a thickness of 20 mm, then set within the reactor 100 of an HVPE system (see FIG. 1). The interior of the reactor 100 was heated to 1020° C., HCl gas was fed in through an inlet 103, and the GaCl gas G3 that formed by reacting with Ga within the reservoir 106 was fed into the reactor through an inlet 104. In the GaN layer growth step on this underlying substrate 110, the reactor temperature of 1020° C. was maintained for 29 hours, the growth pressure was set to $1.01\times10^5$ Pa, the partial pressure of the GaCl gas G3 was set to $6.52\times10^2$ Pa, the $NH_3$ gas G4 partial pressure was set to $7.54\times10^3$ Pa, and the partial pressure of hydrogen chloride (HCl) was set to $3.55\times10^1$ Pa. Following completion of the GaN layer growth step, the temperature at the reactor interior was lowered to room temperature, thereby giving a C plane-grown GaN crystal, which is a Group III nitride crystal. In the resulting GaN crystal, the surface state of the growth face was a mirror surface, the thickness measured with a feeler-type film thickness gauge was 3.5 mm, and the weight measured with a precision scale was 63.0311 g. The GaN crystal obtained was subjected to the next heat treatment (high-temperature corrosion annealing) without carrying out pretreatment such as washing, etching and capping.

Heat treatment was carried out by placing the GaN crystal 201 within an alumina tube ($Al_2O_3$, 99.70) 200 and introducing an ammonia-nitrogen mixed gas at a flow rate of 200 mL/min through a gas inlet 203. The ammonia-nitrogen mixed gas (8.5% $NH_3$+91.5% $N_2$) was used after blending together ammonia gas and nitrogen gas in a 4.9 MPa, 47 liter cylinder, then leaving the mixture to stand for at least 45 days until it became a uniform mixed gas. During temperature ramp-up, a heater 202 was used to raise the temperature from room temperature to 600° C. at a rate of 300° C./hour, then from 600 to 1300° C. at a rate of 250° C./hour. Thereafter, heat treatment was subsequently carried out at 1300° C. for 6 hours. Cooling was subsequently carried out from 1300 to 600° C. at a rate of 100° C./hour. The crystal surface after heat treatment exhibited a black color and substance identification was carried out by x-ray diffraction (XRD) analysis, whereupon gallium hydroxide, gallium oxide and gallium metal were found to be present in admixture. It was confirmed from this that a hydrolysis reaction of the GaN crystal arises due to water molecules created by the reaction of ammonia with the alumina making up the reactor core tube member.

The crystal obtained was immersed in 120° C. concentrated nitric acid (containing 69% $HNO_3$) and the gallium metal adhering to the surface was completely removed, thereby giving a crystal sample on the surface of which remained cream-colored gallium oxyhydroxide and white gallium oxide (Example 1). The weight following concentrated nitric acid treatment was 61.1681 g, and so the loss-of-weight ratio was 2.96%. If it is assumed that only the water molecules in the heat treatment atmosphere contributed to film formation, the concentration of water molecules within the atmosphere can be calculated, using the weight of the crystal before and after heat treatment and the heat treatment atmosphere conditions, by multiplying the amount of oxygen consumed due to film formation by the volume of one mole of the gas, and dividing the resulting value by the total amount of gas that passed through the reactor. The water molecule concentration determined was 1.38%. A film composed of an oxide, hydroxide and/or oxyhydroxide containing a Group III element was thereby formed on a heat-treated crystal surface, and the presence of GaN crystal at the interior was confirmed.

A crystal sample produced without carrying out the above heat treatment (Comparative Example 1) and a crystal sample produced by carrying out 96 hours of heat treatment at 1200° C. (Comparative Example 2) were prepared. The formation of a film composed of an oxide, hydroxide and/or oxyhydroxide containing a Group III element was not observed in the crystal samples in Comparative Examples 1 and 2.

To evaluate the processability of the crystal samples obtained, perpiheral grinding in which the crystal is processed to a roundness in the shape of a wafer and slicing in which the crystal is cut to the thickness of a wafer were carried out as described below.

<Peripheral Grinding>

A vitrified bonded wheel having an average particle size of 25 μm was used as the crystal grinding tool. The working face of the tool was disposed so as to be perpendicular to the (0001) plane of the crystal. The rotational speed of the tool was set to 2500 m/min, and the rotational speed of the crystal was set to 5 mm/sec. The tool was controlled so that the working face approaches the center of the crystal by 0.02 to 0.04 mm per rotation of the crystal.

<Slicing>

A 50 mm diameter, 3.5 mm thick, disk-shaped crystal sample 1 in which the (0001) plane serves as the principal plane was prepared, then immobilized on a mount 2 with an epoxy adhesive as shown in FIGS. 3A and 3B. Here, FIG. 3A is a front view, and FIG. 3B is a side view. A wire saw was furnished for use. The saw was equipped with 70 crystal slicing wires W arranged in parallel, each wire having electrodeposited on the surface thereof diamond abrasive with an average particle size of 12 to 25 μm. Six of the wires were used for slicing the crystal sample. Each of the wires W arranged in parallel was controlled so as to travel by the rotation of a roller R1 and a roller R2 in the same direction, as shown in FIG. 4A, and so as to rock by alternately moving up and down, as shown in FIG. 4B. During operation, the midpoint of the linear portion of the wire formed between roller R1 and roller R2 is set so as not to rock. The maximum swing angle φ of rocking was set to 10°, the maximum traveling speed by the wire was set to 330 m/min, and the wire rocking frequency was set to 800 times/min.

A processing evaluation was carried out on each of the crystals obtained after processing. Ten crystals on which peripheral grinding had been carried out were given a "Pass" rating when cracking did not arise, and were given a "Fail" rating when cracking arose. Evaluation of the slicing operation was then carried out on those crystals given a "Pass" rating in peripheral grinding. Here too, those crystals in which cracking did not arise during slicing were given a "Pass" rating, and those crystals in which cracking arose were given a "Fail" rating. The ratio of the number of crystals (unit %) rated as "Pass" was treated as the processing yield. The results are shown in Table 1 below.

TABLE 1

| | Heat treatment conditions | Film composed of Group III element-containing compound (present/absent) | Yield (%) | |
|---|---|---|---|---|
| | | | Slicing | Peripheral grinding |
| Example 1 | 1300° C., 6 hours | present | 70 | 100 |
| Comparative Example 1 | no heat treatment | absent | 10 | 90 |
| Comparative Example 2 | 1200° C., 96 hours | absent | 33 | 100 |

As shown in Table 1, it was confirmed that carrying out heat treatment on a GaN crystal improves the processability and the yield markedly increases the yield.

The processing damage resistance was measured for the GaN crystal produced in Example 1, and found to be 8.9 J/m$^2$. The maximum dislocation propagation distance near the center of the GaN crystal substrate produced in Example 1 was measured, and found to be 25.9 μm.

(2) Heat Treatment and Measurement of Numerical Density of Dislocation Aggregates A C plane-grown GaN crystal having a thickness of 3.5 mm was obtained by the same method as in (1) above. This crystal was cleaved at the M plane and A plane to ¼ size, following which 6 hours of heat treatment at 1300° C. was carried out by the same method as in (1), giving a crystal with a black-colored surface. This was immersed in 120° C. nitric acid (99.9%) to completely remove the gallium metal, thereby giving a crystal sample with cream-colored gallium hydroxide and white gallium oxide remaining on the crystal surface.

In addition to the above heat-treated crystal sample (Example 11), a crystal sample for comparison that had not been heat-treated (Comparative Example 11) was also obtained.

An M plane slice was cut out of each of the crystal samples obtained and the M plane on one side of each sample was chemically polished to a surface state suitable for fluorescent microscopic examination and SEM-CL examination, thereby giving M plane single side-polished samples having a uniform thickness of 3.0±0.05 mm. In addition, C plane double side-polished samples having a uniform thickness of 1.3±0.05 mm were separately obtained by grinding and polishing at least 500 μm of the C plane front and back so as to remove the gallium hydroxide layer and gallium oxide layer on the C plane front and back, then chemically polishing to a surface state suitable for SEM-CL examination.

Figure 5:
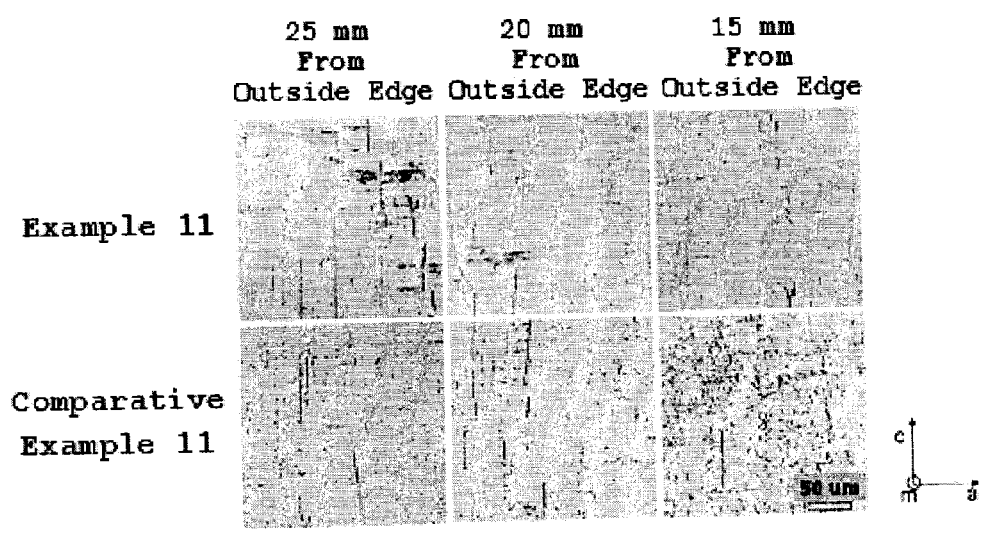
FIG. 5 presents cathodoluminescence scanning electron microscopic images showing the distribution in basal plane dislocations.

Upon examining the polished surface on each of the M plane single side-polished samples with a fluorescence microscope (magnification, 5×), dislocation aggregates in which basal plane dislocations had gathered were observed at sizes of 10 to 50 μm in the sample in Example 11 on which heat treatment had been carried out. Using the same fluorescence microscope, the number of dislocation aggregates present over a surface area of about 0.0054 cm$^2$ was counted at respective sites 25 mm, 20 mm and 15 mm from the outside edge of the M plane single side-polished sample. To calculate the numerical density of the dislocation aggregates, this number was divided by the surface area of measurement. Using a cathodoluminescence scanning electron microscope, the number of isolated dislocations (dislocations that do not form dislocation aggregates and are isolated) present in a surface area of 0.0017 cm$^2$ was counted, and the numerical density of isolated dislocations was calculated. The results are shown in Table 2 below. The results of cathodoluminescence scanning electron microscopic examination are shown in FIG. 5.

locations was entirely absent in fluorescence microscopic examination of the M plane cross-section.

TABLE 2

| Sample | Heat treatment (yes/no) | Measurement site | Numerical density A of dislocation aggregates (number/cm$^2$) | Numerical density B of isolated dislocations (number/cm$^2$) | Dislocation density A/B (%) |
|---|---|---|---|---|---|
| Example 11 | yes | 25 mm from outside edge | 1.80 × 10$^4$ | 4.06 × 10$^5$ | 4.43 |
|  |  | 20 mm from outside edge | 9.60 × 10$^2$ | 2.94 × 10$^5$ | 3.27 |
|  |  | 15 mm from outside edge | 1.40 × 10$^4$ | 4.18 × 10$^5$ | 3.35 |
| Comparative Example 11 | no | 25 mm from outside edge | 2.60 × 10$^2$ | 9.71 × 10$^5$ | 0.27 |
|  |  | 20 mm from outside edge | 3.40 × 10$^2$ | 1.52 × 10$^6$ | 0.22 |
|  |  | 15 mm from outside edge | 5.90 × 10$^2$ | 4.65 × 10$^6$ | 0.13 |

As is apparent from Table 2, it was confirmed that by carrying out heat treatment, the numerical density of dislocation aggregates increases and the numerical density of isolated dislocations decreases, the net effect being the concentration of dislocations in the dislocation aggregates.

One of the dislocation aggregates in the heat-treated sample in Example 11 was examined more closely using a cathodoluminescence scanning electron microscope. The cathodoluminescence scanning electron microscope used had a spacial resolution of 3 nm, and the electron beam acceleration voltage was set to 3 kV. The incident electron beam was made parallel with the m-axis direction. As a result of observation, a structure having basal plane dislocations arranged at intervals of from 50 to 500 nm in the c-axis direction was observed over a range of at least 5 μm in both the c-axis direction and the a-axis direction.

Dislocation aggregates in the Comparative Example 11 sample that was not subjected to heat treatment were similarly examined using a cathodoluminescence scanning electron microscope. As a result, although these were confirmed to have structures in which the dislocations are arranged at intervals of 50 to 500 nm, the groups had ranges of less than 5 μm in both the c-axis direction and the a-axis direction.

For the sake of reference, even when a crystal sample (Comparative Example 12) which, as in Comparative Example 11, had not been heat-treated was polished in an M plane cross-section and heat-treated for 6 hours at 900° C. in the same environment as in Example 12, a film composed of an oxide, hydroxide and/or oxyhydroxide did not form. In fluorescence microscopic examination of the M plane cross-section, the formation of groups that accompanies the migration of basal plane dislocations was entirely absent.

Moreover, even when heat treatment at 1200° C. was carried out for 24 hours in the same environment (Comparative Example 13), a film composed of oxide, hydroxide and/or oxyhydroxide did not form and the formation of groups that accompanies the migration of basal plane dis- (3) Measurement of Lattice Spacing To quantitatively examine stress distribution throughout the crystal, lattice spacing measurement was carried out by x-ray diffraction analysis in the following manner on the sample from Example 11 that was subjected to heat treatment in (2) above and the sample from Comparative Example 11 that was not subjected to heat treatment.

Measurement of the lattice spacings in these samples was carried out using a high-resolution x-ray diffractometer.

Using a CuKα line generated by an x-ray tube as the x-ray beam, the beam was narrowed with a monochromator and a pinhole-type slit, and adjusted so that the Gaussian beam approximation full width at half maximum (FWHM) at the sample surface became 100 μm in the horizontal direction and 200 μm in the vertical direction. The sample was immobilized on a sample stage so that the c-axis direction was parallel with the horizontal direction. Next, 2θ-ω scans of the (30-30) plane were successively carried out at 100 μm intervals over a length of 3.5 mm along the direction of crystal growth (c-axis direction), and the change in lattice spacing was examined. During the 2θ-ω scans, an analyzer crystal and a proportional detector were used on the light-receiving side. The temperature within the x-ray unit housing was controlled to within 24.5±1° C., an effort being made to suppress the influence of temperature fluctuations on measurement.

Figure 6:
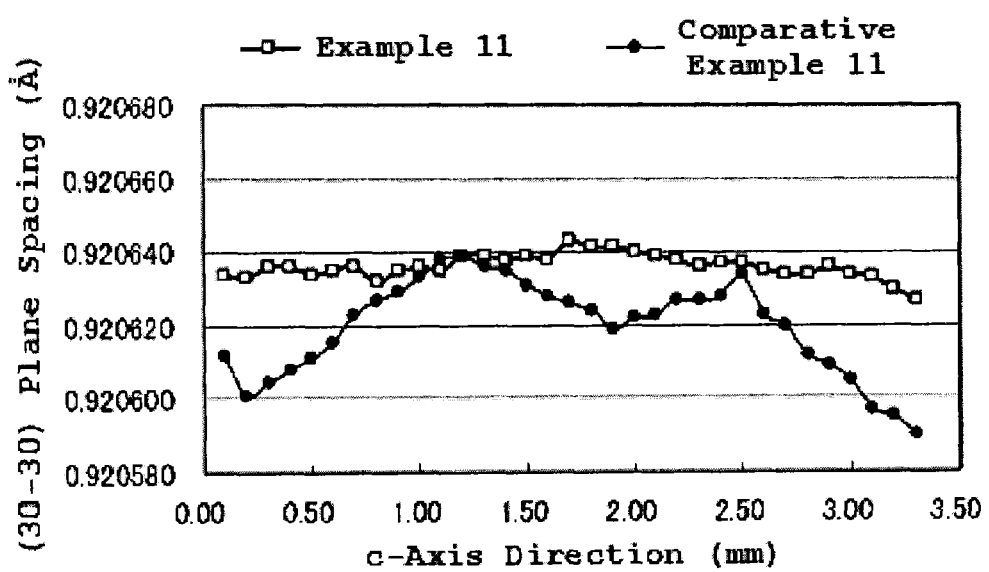
FIG. 6 is a graph showing the results of lattice spacing measurements in the (30-30) plane.
Figure 7:
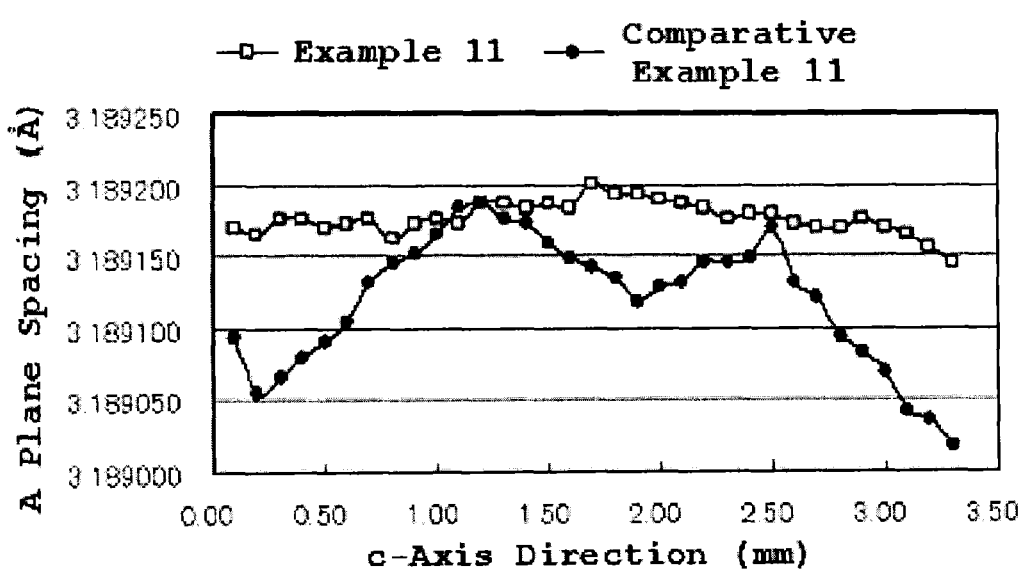
FIG. 7 is a graph obtained by converting FIG. 6 to a curve of the change in the a-axis length.

The change in lattice spacings on the (30-30) plane at the center of the respective sample substrates in Example 11 and Comparative 11 was measured. The results are shown in FIG. 6. The maximum value d(max), minimum value d(min), average value d(ave) and [d(max)−d(min)]/d(ave) value of the lattice spacings were as shown in Table 3 below. FIG. 7 shows the results obtained when FIG. 6 was converted into a-axis length change data by multiplying the spacing on the (30-30) plane by 2√3 and converting this to the change in the a-axis length.

TABLE 3

| Sample | Heat treatment (yes/no) | Lattice spacing in (30-30) plane [Å] | | | |
|---|---|---|---|---|---|
|  |  | Maximum value d(max) | Minimum value d(min) | Average value d(ave) | [d(max) − d(min)]/ d(ave) |
| Example 11 | yes | 0.920643 | 0.920627 | 0.920636 | 1.738 × 10$^{-5}$ |
| Comparative Example 11 | no | 0.920639 | 0.920590 | 0.920620 | 5.322 × 10$^{-5}$ |

As is apparent from Table 3, it was confirmed that the change in the lattice spacing is suppressed by carrying out heat treatment in accordance with the present invention.

While the invention has been described in detail and with reference to specific embodiments thereof, it will be apparent to one skilled in the art that various changes and modifications can be made therein without departing from the spirit and scope thereof.

INDUSTRIAL APPLICABILITY

This invention relates to a single-crystal gallium nitride (GaN) substrate which can be used as a substrate for blue light-emitting devices such as blue light-emitting diodes (LED) and blue semiconductor lasers (LD) composed of Group III nitride semiconductors, a method of growing single-crystal gallium nitride substrates (GaN), and a method of producing single-crystal gallium nitride substrates (GaN).

EXPLANATION OF REFERENCE NUMERALS

1 Crystal sample
2 Mount
W Wire
φ Maximum swing angle of rocking
R1, R2 Rollers
100 Reactor
101 to 105 Gas inlets
106 Gallium reservoir
107 Heater
108 Substrate holder
109 Exhaust line
110 Underlying substrate
200 Alumina tube
201 Crystal
202 Heater
203 Gas inlet
204 Gas exhaust line

The invention claimed is:

1. A Group III nitride crystal, comprising a part, wherein $\Delta d/d(\text{ave})$ is $4\times10^{-5}$ or less, and $\Delta d/d(\text{ave})$ is defined as follows:

$$\Delta d/d(\text{ave})=[d(\text{max})-d(\text{min})]/d(\text{ave}),$$

where $d(\text{max})$, $d(\text{min})$ and $d(\text{ave})$ are respectively maximum, minimum and average values of lattice spacing of (30-30) plane, as measured at 100 μm intervals over a length of 3.5 mm along a c-axis direction.

2. The Group III nitride crystal according to claim 1, wherein
$\Delta d/d(\text{ave})$ is $3\times10^{-5}$ or less.

3. The Group III nitride crystal according to claim 2, wherein
$\Delta d/d(\text{ave})$ is $2\times10^{-5}$ or less.

4. The Group III nitride crystal according to claim 1, wherein a direction of crystal growth is a c-axis direction.

5. The Group III nitride crystal according to claim 1, wherein the Group III nitride crystal comprises GaN.

6. A Group III nitride substrate, comprising the Group III nitride crystal according to claim 1.

* * * * *

UNITED STATES PATENT AND TRADEMARK OFFICE
CERTIFICATE OF CORRECTION

| | | |
|---|---|---|
| PATENT NO. | : 9,502,241 B2 | Page 1 of 1 |
| APPLICATION NO. | : 14/054036 | |
| DATED | : November 22, 2016 | |
| INVENTOR(S) | : Hajime Matsumoto et al. | |

It is certified that error appears in the above-identified patent and that said Letters Patent is hereby corrected as shown below:

On the Title Page

Item (73), should read:
--(73) Assignee: MITSUBISHI CHEMICAL CORPORATION, Chiyoda-ku (JP)--

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*